(12) United States Patent
Hayashi

(10) Patent No.: US 7,126,670 B2
(45) Date of Patent: Oct. 24, 2006

(54) POSITION MEASUREMENT TECHNIQUE

(75) Inventor: Nozomu Hayashi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/085,545

(22) Filed: Mar. 22, 2005

(65) Prior Publication Data
US 2005/0219491 A1    Oct. 6, 2005

(30) Foreign Application Priority Data
Mar. 31, 2004  (JP) ............................ 2004-106361

(51) Int. Cl.
*G03B 27/52*  (2006.01)
*G03B 27/42*  (2006.01)

(52) U.S. Cl. ........................... 355/55; 355/53

(58) Field of Classification Search ............... 355/52, 355/53, 55, 67, 69; 250/548; 356/399–401; 430/311
See application file for complete search history.

(56) References Cited

U.S. PATENT DOCUMENTS

| | | | |
|---|---|---|---|
| 5,493,402 A | * | 2/1996 | Hirukawa ............... 356/400 |
| 5,680,200 A | * | 10/1997 | Sugaya et al. ............... 355/53 |
| 5,808,910 A | * | 9/1998 | Irie et al. ............... 700/279 |
| 6,762,825 B1 | | 7/2004 | Hayashi et al. ............... 355/55 |
| 6,930,016 B1 | | 8/2005 | Mishima et al. ............ 438/401 |
| 2005/0030537 A1 | | 2/2005 | Hayashi et al. ............. 356/401 |
| 2005/0062967 A1 | | 3/2005 | Kobayashi ................. 356/400 |

FOREIGN PATENT DOCUMENTS

| | | |
|---|---|---|
| JP | 04-032219 | 2/1992 |
| JP | 2003-92247 | 3/2003 |
| JP | 2004-014758 | 1/2004 |
| WO | WO 03/104746 A1 | 12/2003 |

\* cited by examiner

*Primary Examiner*—Henry Hung Nguyen
(74) *Attorney, Agent, or Firm*—Fitzpatrick, Cella, Harper & Scinto

(57) ABSTRACT

A position measurement apparatus for measuring a position of a mark includes an image capturing unit, a calculating unit which obtains variation in image data captured by the image capturing unit, and a setting unit which sets a parameter concerning a light receiving amount of the image capturing unit based on variations respectively obtained by the calculating unit with respect to a plurality of image data acquired by the image capturing unit at different light receiving amounts.

27 Claims, 13 Drawing Sheets

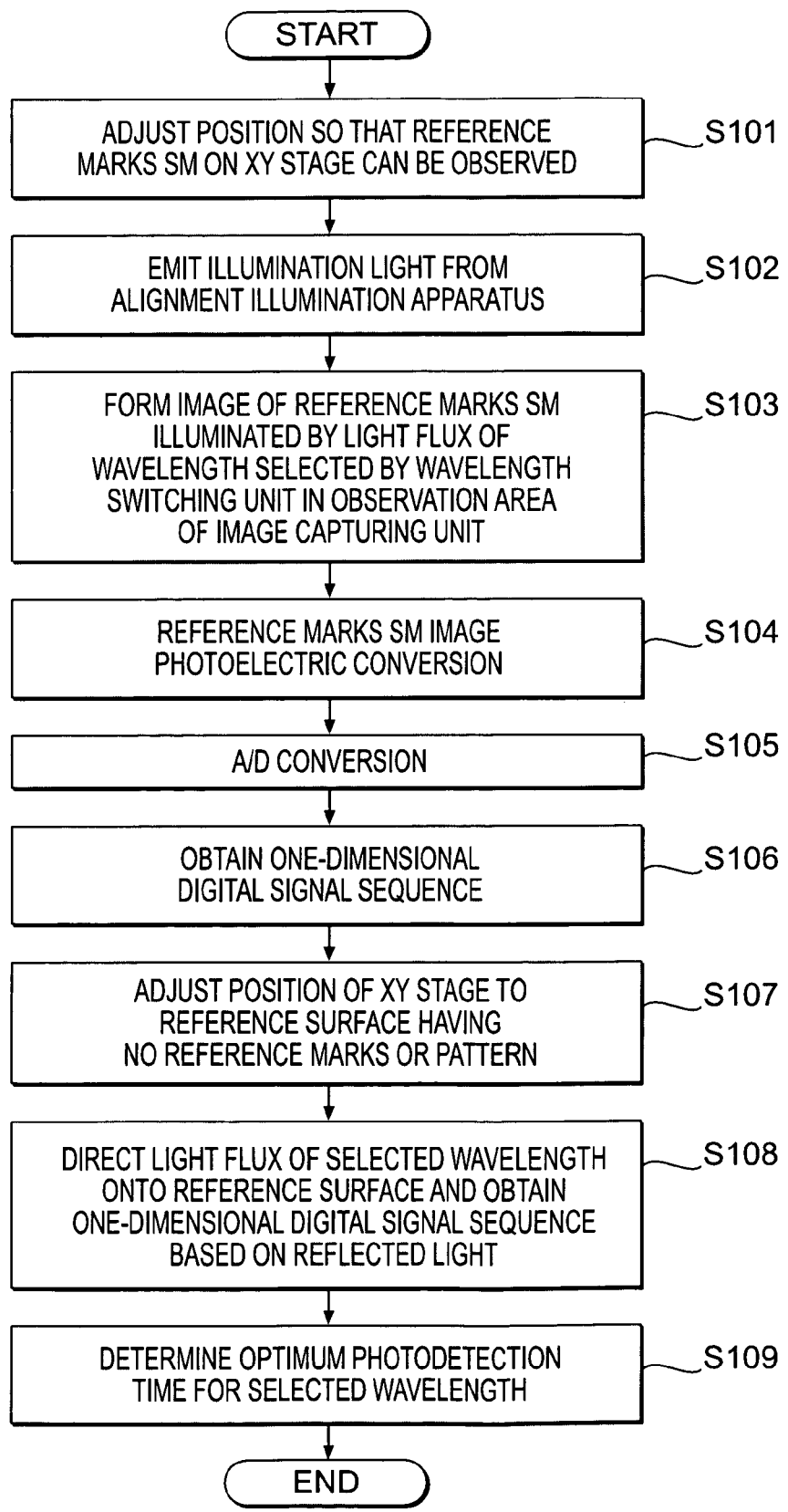
F I G. 1 B

| WAVELENGTH $\lambda_i$ | $\lambda_1$ | $\lambda_2$ | $\lambda_3$ | $\lambda_4$ | ------------ | $\lambda_n$ |
|---|---|---|---|---|---|---|
| PHOTODETECTION TIME $t_{cimin}$ | $t_{c1min}$ | $t_{c2min}$ | $t_{c3min}$ | $t_{c4min}$ | ------------ | $t_{cnmin}$ |

FIG. 3C

| WAVELENGTH | $\lambda_1$ | | | | |
|---|---|---|---|---|---|
| PHOTODETECTION TIME | tc1 | tc2 | tc3 | ------------ | tcm |
| dM1 | dM11 | dM12 | dM13 | ------------ | dM1m |
| dM2 | dM21 | dM22 | dM23 | ------------ | dM2m |
| dM3 | dM31 | dM32 | dM33 | ------------ | dM3m |
| dM4 | dM41 | dM42 | dM43 | ------------ | dM4m |
| STANDARD DEVIATION $\sigma$ | $\sigma_1$ | $\sigma_2$ | $\sigma_3$ | ------------ | $\sigma_m$ |

FIG. 4B

| WAVELENGTH | $\lambda_1$ | | | |
|---|---|---|---|---|
| ALLOWABLE STANDARD DEVIATION | $\sigma_{ai}$ | | | |
| PHOTODETECTION LEVEL | H1 | H2 | ---------- | Hm |
| dM1 | dM11 | dM12 | ---------- | dM1m |
| dM2 | dM21 | dM22 | ---------- | dM2m |
| dM3 | dM31 | dM32 | ---------- | dM3m |
| dM4 | dM41 | dM42 | ---------- | dM4m |
| STANDARD DEVIATION $\sigma$ | $\sigma_1$ | $\sigma_2$ | ---------- | $\sigma_m$ |

POSITION MEASUREMENT TECHNIQUE

FIELD OF THE INVENTION

The present invention relates to a position measurement technique of measuring a position of a mark, or the like.

BACKGROUND OF THE INVENTION

In an exposure apparatus for semiconductor manufacture, and the like, as a method of detecting the position of the areas of a wafer to be exposed, there is one that discharges light having a predetermined wavelength using an alignment optical system and utilizes the results of the photoelectric conversion of the light reflected from an alignment mark for position detection. Below, a brief description is given of a conventional example of a semiconductor manufacturing exposure apparatus using this technology.

In the exposure apparatus shown in FIG. 5, R designates an original (hereinafter, also called a reticle), on which an electronic circuit pattern is formed, W designates a wafer that is an exposure substrate, and reference numeral 1 designates a projection optical system. In addition, S designates an alignment optical system, 2 designates an alignment illumination device, 3 designates a beam splitter, 4 and 5 designate image formation optical systems, 6 designates an image capturing unit, 7 designates an A/D conversion unit, 8 designates an integrating device, and 9 designates a position detecting unit. Reference numeral 10 designates a wavelength switching unit, 11 designates an XY stage movable in two dimensions, and 13 designates a stage control unit. The stage control unit 13 can position the XY stage at a predetermined position based on detection results of the position detecting unit 9. Reference numeral 14 designates an exposure illumination light source, which illuminates the reticle R. Here, in FIG. 5, although only the alignment optical system S that detects position in the X direction is shown, it is to be understood that, similarly, an alignment optical system for detecting position along the Y axis (a direction perpendicular to the surface of the paper on which the drawing is made) is also provided on the exposure apparatus. The exposure apparatus used for semiconductor manufacture shown in FIG. 5, after relative alignment of the reticle R and the wafer W, emits exposure light from the exposure illumination light source 14 and, through the projection optical system 1, projection-exposes the electronic circuit pattern formed on the reticle R onto the wafer placed on the XY stage 11.

Next, a description is given of a position detecting method of the above-described exposure apparatus. As an initial matter, first, the position of the XY stage is adjusted so that alignment marks WM on the wafer W can be seen in an image capturing screen of the image capturing unit 6. Next, non-exposure light is emitted from the alignment illumination device 2 and the wavelength switched by the wavelength switching unit. A light flux whose wavelength has been switched illuminates the alignment marks WM through the image formation optical system 4 and the beam splitter 3. The light flux reflected from the illuminated alignment marks WM passes through the beam splitter 3 and the image formation optical system 5 and forms an image of the alignment marks obtained from the reflection in an observation area (WP) on the image capturing surface of the image capturing device 6 (FIG. 2E). The image capturing device 6 photoelectrically converts the image of the alignment marks.

Thereafter, an output from the image capturing device 6 is converted into a two-dimensional digital sequence at the A/D conversion device 7. The integrating device 8 converts the two-dimensional signal that is the output of the A/D conversion device 7 into a one-dimensional digital signal sequence $S1(x)$. After conversion to the one-dimensional digital signal sequence $S1(x)$, the position detecting unit 9 detects the positions of the alignment marks WM.

The creation of the one-dimensional digital signal sequence $S1(x)$ by the integrating device 8 necessitates (1) the photoelectric conversion in the image capturing unit 6, and the A/D conversion in the A/D conversion unit 7 must be carried out within the respective dynamic ranges, and (2) that the photodetection levels be sufficient for detection of the positions of the alignment marks WM by the image capturing unit 6. If these two conditions are satisfied, it is possible to carry out detection of the positions of the alignment marks accurately.

A position detection technique that can determined whether or not the image capture detection level is within a predetermined range, as well as that can enable image capturing of a mark at an appropriate photodetection level based on the results of that determination, is disclosed in Japanese Laid-Open Patent Publication (Kokai) No. 2003-092247.

However, in recent years, the density of semiconductors typified by the DRAM has continued to increase, as has the degree of accuracy required of alignment mark position detection. In order to adjust the photodetection level of the image capturing unit 6, one method adjusts the intensity of the illumination of the alignment illumination device using an ND filter, or the like, not shown, and another method adjusts the image capturing unit 6 photodetection time (that is, the charge storage time of a photoelectric conversion device such as a CCD). However, in a case in which a primary digital sequence $S(x)$ is generated to obtain the S/N ratio of such a sequence $S(x)$ after A/D conversion of the results of photoelectric conversion by the image capturing unit 6, the effects of optical noise caused by flickering of the light source of the alignment illumination device 2 and electrical noise from the image capturing unit 6 and the A/D conversion unit 7 mean that, even if adjustment is made so that the photodetection level is the same, the S/N ratio of the one-dimensional digital signal sequence $S(x)$ varies due to the photodetection level or to the combination of the illumination intensity and the photodetection time. This means that, even with the same photodetection level, the alignment mark position detection accuracy fluctuates, and consequently, in some cases, there is a risk that the alignment mark position detection accuracy deteriorates, and it is possible that there are instances in which simply keeping the photodetection level within a predetermined tolerance is inadequate.

SUMMARY OF THE INVENTION

The present invention has as an exemplified object to provide a novel position measurement technique that suppresses deterioration in accuracy.

In order to achieve the above-described object, the present invention provides a position measurement apparatus for measuring a position of a mark, the apparatus comprising:

an image capturing unit;

a calculating unit which obtains variation in image data captured by the image capturing unit; and a setting unit which sets a parameter concerning a light receiving amount of the image capturing unit, based on variations respectively obtained by the calculating unit with respect to a plurality of image data acquired by the image capturing unit at different light receiving amounts.

Other features, objects and advantages of the present invention are apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1B is a flow chart illustrating the flow of a position detection process according to the first embodiment of the present invention;

FIG. 3C is a diagram summarizing, in data table form, detection results for spans dM1–dM4, in a case in which the photodetection time is varied from tc1 to tc2, tc3, ... tcm, for a light flux of wavelength λ1;

FIG. 4B is a diagram showing the relation between detection results for mark spans dM1–dM4 and the standard deviation at that time, in a case in which the wavelength λ of the light flux used for position detection is λi and the photodetection level is set to Hi;

DETAILED DESCRIPTION OF THE INVENTION

Preferred embodiments of the present invention will now be described in detail in accordance with the accompanying drawings.

First Embodiment

A description will now be given of an embodiment adapting the position detecting method of the present invention to an exposure apparatus.

Figure 1A:
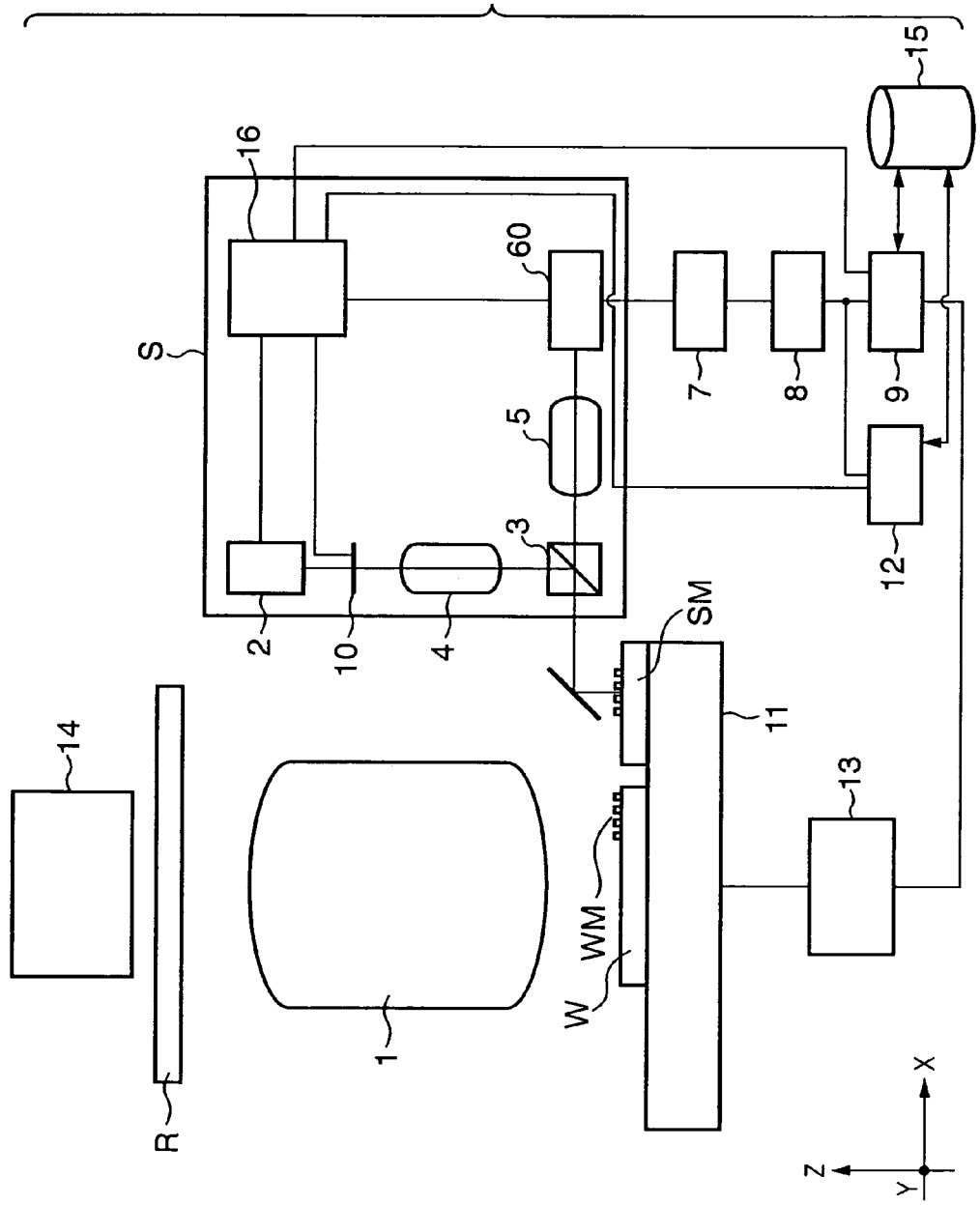
FIG. 1A is a diagram showing the configuration of an exposure apparatus according to a first embodiment of the present invention.

FIG. 1A is a diagram showing the configuration of an exposure apparatus according to a first embodiment of the present invention. In the diagram, R designates a reticle on which an electronic circuit pattern is formed, W designates an exposure substrate wafer, and reference numeral 1 designates a projection optical system. The projection optical system 1 projects the reticle R electronic circuit pattern image onto the wafer W based on a projection beam emitted from an illumination light source 14.

S designates an alignment optical system, and includes an illumination apparatus, a beam splitter, an image formation optical system, an image capturing unit and a control unit. Reference numeral 2 designates the positioning illumination device that emits illumination light for use in position detection, 3 designates the beam splitter, and 4 and 5 designate the image formation optical system. Reference numeral 60 designates the image capturing device, which is capable of adjusting the photodetection time (storage time) for photodetection of a reflection of the light emitted from the illumination device 2. Reference numeral 16 designates a control unit, which controls the intensity of the light flux emitted from the illumination device 2 and sets the position detection time for the light flux that the image capturing device 60 photodetects based on results of evaluations by an image capturing evaluation unit 12. The image capturing unit 60 photodetects the reflection of the light emitted from the illumination device 2 according to the photodetection time so set.

Reference numeral 7 designates and A/D conversion unit for converting the results processed by the image capturing unit 60 into digital signals, 8 designates an integrating unit capable of performing calculations on the digital signals, and 9 designates a position detecting unit for detecting the position of a detection target based on the digital signals. Reference numeral 10 designates a wavelength switching unit for switching the wavelength of the illumination light, and in the detection of the position of a detection target, it is possible to switch to illumination light of different wavelengths when irradiating a position detection target with the position detection illumination light. The switching of the wavelengths can be controlled by the control unit 16. Reference numeral 111 designates an XY stage movable in two dimensions and 13 designates a stage control unit. The XY stage 11, when exposing the wafer W, under the control of the stage control unit 13, moves and positions the wafer W in order to expose an exposure region of the wafer W, and during position detection can position reference marks SM, provided on the XY stage 11 so that the image capturing unit 60 may detect the position of the exposure regions of a wafer W placed on the XY stage, within an observable area (WP) of the image capturing unit 60.

Reference numeral 12 designates the image capturing evaluation unit, which can measure variation in the calculation results provided by the integrating unit 8 and can perform statistical processing, such as calculating standard deviation, range, and the like, as well as calculations concerning error evaluation, such as a least squares operation, and the like. Reference numeral 15 designates a database for saving the results of detections and evaluations performed by the position detection unit 9 and the image capturing evaluation unit 12, and can be written to and read from in a state in which the database is stored in a memory.

Figure 2A:
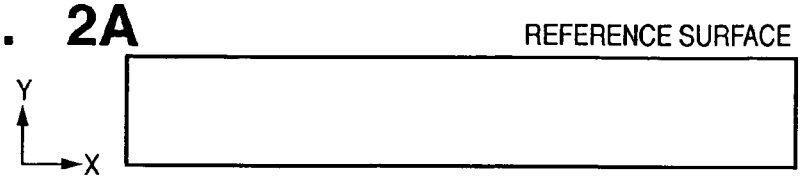
FIGS. 2A–2E are diagrams illustrating image capture of a reference surface and reference marks.
Figure 2B:
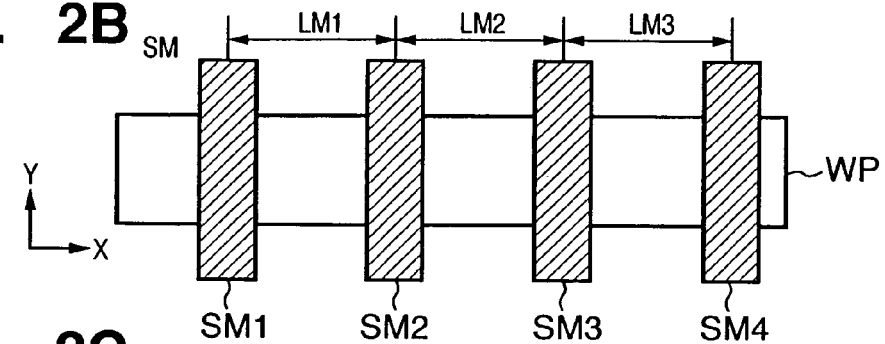

FIG. 1B is a flow chart illustrating the flow of a position detection process according to the first embodiment of the present invention. First, in step S101, position adjustment is carried out by moving the XY stage 11 by the stage control unit 13 so that reference marks SM on the XY stage 11 can be observed within an image capturing surface (WP) of the image capturing unit 60. As shown in FIG. 2B, a plurality of rectangular-shaped reference marks SM are provided on the XY stage 11, within the XY plane of the stage 11. The WP is an observation area showing the image capturing screen of the image capturing unit 60, and in step S101, once the reference marks (SM) of the XY stage come within the observation area (WP) of the image capturing unit 60 and adjustment made to positions at which the four reference marks can be observed, processing proceeds to step S102 and illumination light is emitted from the alignment illumination device 2.

In step S103, the reference marks SM on the XY stage are illuminated by a light flux having a wavelength selected by the wavelength switching unit 10, via the image formation optical system 4 and the beam splitter 3. The light flux reflected from the reference marks SM once again returns to the beam splitter 3 and, through the image formation optical system 5, forms an image of the reference marks SM inside the observation area (WP) of the image capturing device 60.

In step S104, the image capturing device 60 photoelectrically converts the images of the reference marks SM, and thereafter, the output from the image capturing device 60 is input to the A/D conversion device 7, and the A/D conversion device 7 converts the result of the photoelectric conversion into a two-dimensional digital signal sequence (S105). The photodetection level (illumination level=light flux intensity×photodetection time) can be adjusted by the adjustment of the photodetection time performed by the image capturing device 60.

Figure 2C:
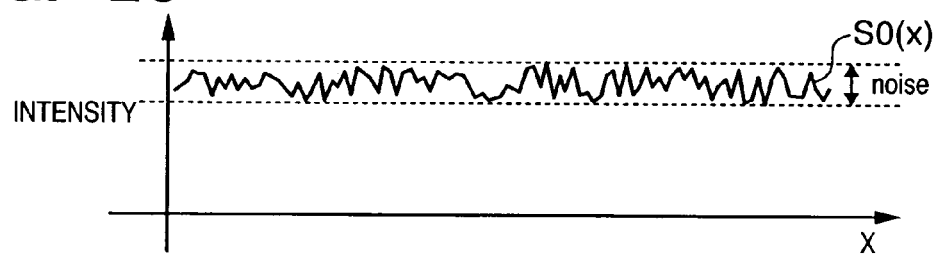
Figure 2D:
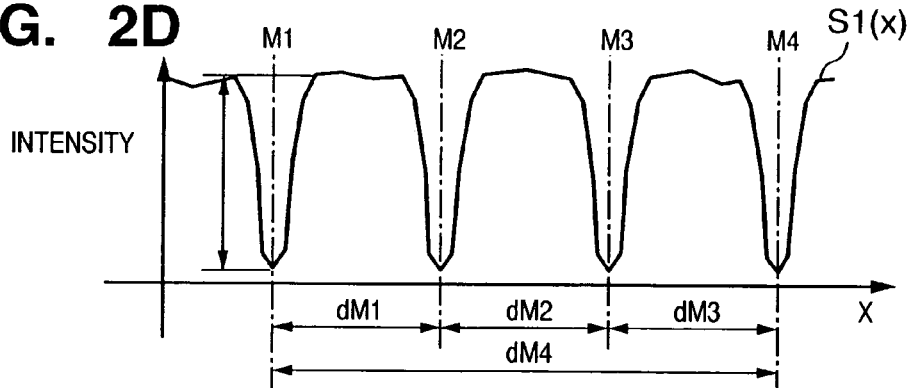
Figure 2E:
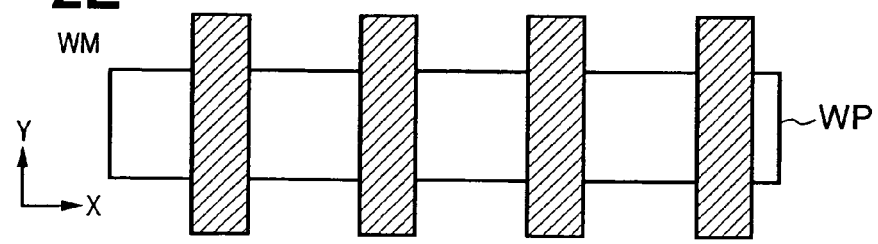

In step S106, the integrating device 8 integrates the two-dimensional signal that is the output of the A/D conversion device 7 along the Y direction and the X direction, processing them into one-dimensional digital signal sequence S1($x$) or S1($y$) (FIG. 2D is a diagram showing an example of a digital signal sequence in the X direction obtained by integrating in the Y direction). The one-dimensional digital signal sequence may, for example, be a one-dimensional digital signal sequence S1($x$) (for example, such a contrast being at a maximum as a condition), the alignment of the image capturing unit 60 and the reference marks SM can be determined. (It should be noted that this alignment becomes possible by the movement of the optical elements in the alignment optical system, the image capturing unit 60 and the reference marks SM.) The process for obtaining the contrast can be executed by the position detecting unit 9. In addition, by differentiation of the one-dimensional digital signal sequence S1($x$) obtained by the integrating unit 8 with respect to the position ($x$) in the observation area (WP) of the image capturing unit 60, the position detecting unit 9 can obtain the slope and distribution of the one-dimensional digital signal sequence S1($x$), as well as the maximum value of the intensity of the light flux and the distribution of the intensity of the light flux photodetected by the image capturing unit 60. In FIG. 2D, signal level peaks (M1–M4) occur corresponding to the positions of the reference marks SM1–SM4 (FIG. 2B). By combining the intervals between the peaks dM1–dM3 and the reference mark normalized disposition intervals LM1–LM3 (FIG. 2B), the image capturing unit 60 and the reference mark SM can be aligned. In other words, while varying the photodetection time of the image capturing unit 60, the photodetection time for which variation in misalignment with respect to the normalized positions of the peak positions M1–M4 is at its smallest, image capturing is performed by the image capturing unit 60 using that photodetection time, and, based on the contrast of the captured image thus obtained, the reference marks SM and the image capturing unit 60 can be aligned.

Next, the effects of the flickering of the beam emitted at each wavelength selected for use in position detection and electrical noise are obtained. First, in step S107, in order to irradiate a region lacking reference marks and patterns and used for detection by position detection illumination, as shown in FIG. 2A, the position of a region that can be observed (e.g., a detection region on the XY stage in which reference marks SM do not exist (hereinafter, also called a reference surface)) is adjusted so as to be observable within an image capturing screen (WP) of the image capturing unit 60. Then, as with the processing performed on the reference marks SM described above, this reference surface is irradiated with a light flux having a selected wavelength, the reflected beam is photodetected by the image capturing unit 60 after passing through the beam splitter 3 and the image formation optical system 5 to perform photoelectric conversion of the reflected beam from the reference surface. Then, the results of the photoelectric conversion by the image capturing unit 60 are thereafter A/D converted by the A/D conversion device 7 and a one-dimensional digital signal sequence for the reference surface is obtained. Thus, for each photodetection time tc at the image capturing unit 60, the relation between the one-dimensional digital sequence for the reference marks SM and the one-dimensional digital signal sequence for the reference surface (that is, the S/N ratio) can be obtained.

FIG. 2C is a diagram showing an example of a one-dimensional digital signal sequence Sθ($x$) as a one-dimensional digital signal sequence in the X direction. In a case in which, from the distribution of the sequence Sθ($x$), the reference surface containing no pattern and without reference marks is observed, due to the flickering of the light source of the alignment illumination device 2 and the electrical characteristics of the image capturing device, the digital signal sequence is not constant, but shows variation like that shown in FIG. 2C. This variation (for example, standard deviation) is obtained by the image capturing evaluation unit 12, which determines the appropriate photodetection time based on this variation (S109). The position detection thus determined is then set in the image capturing unit 60 by the control unit 16.

Figures 3A, 3B:
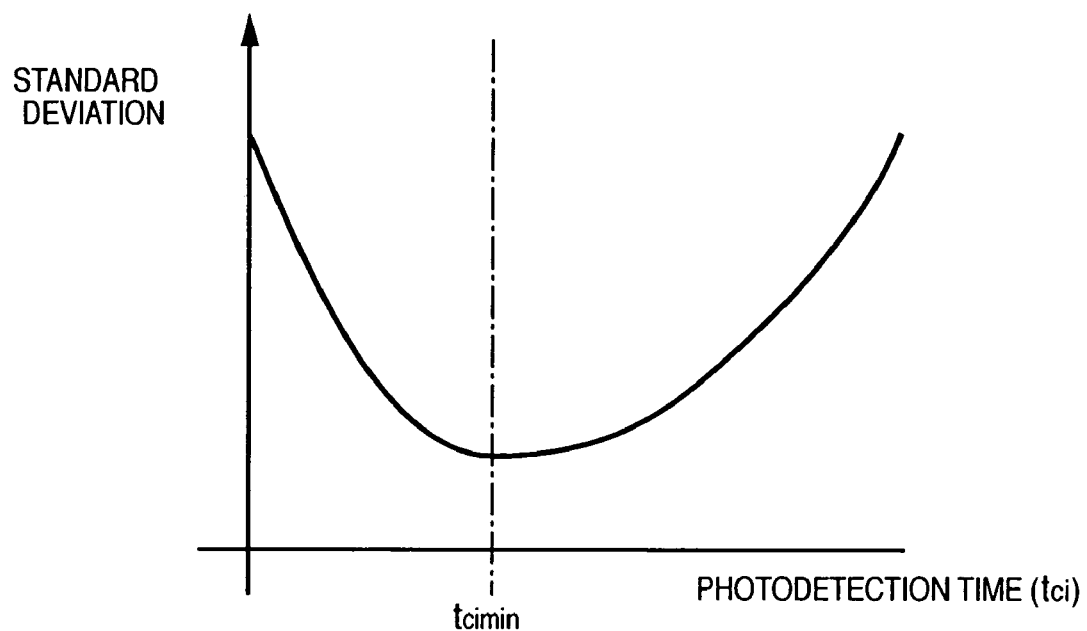
FIG. 3A is a diagram showing the relation between position detection time and noise component standard deviation.
FIG. 3B is a diagram showing the relation between the wavelengths λ of illumination light switched by the switching unit 10 and the photodetection level (tcimin) time for a given wavelength.

As a specific process for determining the appropriate photodetection time, there is, for example, that which, as shown in FIG. 3A, sets the photodetection time tci at the image capturing unit 60 on the horizontal axis, sets the variation in the one-dimensional digital signal sequence based on the reflected beam at the reference surface (that is, an index of the variation obtained by the image capturing evaluation unit 12, such as the standard deviation, range, etc.) on the vertical axis, and from the relation between the two, obtains the photodetection time tcimin at which the variation in the one-dimensional digital signal sequence is at its smallest. The photodetection time tcimin can be identified as the photodetection time at which the value of the standard deviation is at its smallest by obtaining the standard deviation while varying the photodetection time as shown in FIG. 3A. The photodetection time tcimin is the photodetection time at which the effects of the variation caused by flickering of the light source of the illumination device 2 and electrical noise can be minimized and, if image capturing the alignment marks within this photodetection time with the image capturing unit 60, the S/N ratio can be maximized.

The above-described process is executed for all wavelengths λi of illumination lights for which switching by the wavelength switching unit 10 is possible to obtain for each wavelength λi the photodetection time tcimin at which variation of the reference surface one-dimensional digital signal sequence is at its smallest. FIG. 3B is a diagram showing the relation between the wavelengths λi of an illumination light switched by the wavelength switching unit 10 and the photodetection time tcimin. By switching the photodetection time tcimin depending on the selected wavelength, noise due to flickering of the illumination light, and the like, can be reduced and the image capturing unit 60 photodetection level can be adjusted so that the S/N ratio is at its greatest.

The relation shown in FIG. 3B between wavelength and photodetection time may be stored in the database 15 in the memory in the form of a lookup table (LUT), for example, and position detection can be executed in the photodetection time adapted to the selected wavelength referring to the LUT during alignment detection of the wafer by the exposure apparatus.

It should be noted that although in the present embodiment the one-dimensional digital signal sequence shown in FIGS. 2C and 2D relates to the X-axis direction, alternatively, the Y-axis direction digital signal sequence may be used. In addition, the photodetection time (tcimin) may be determined based on the data of the signal sequence in each direction or in both directions.

Second Embodiment

In the first embodiment of the present invention, in order to determine the photodetection time tci, the minimum photodetection time (tcimin) was determined based on the one-dimensional digital signal sequence when the reference marks SM provided on the XY stage and the surface with no reference marks (the reference surface) were observed. However, in the present embodiment, the optimum photodetection time is obtained using as an index only the position detections results of the reference marks SM. In the present embodiment, the process of adjusting the image capturing unit 60 and the reference marks SM so that they are in alignment based on the one-dimensional digital signal sequence corresponding to the reference on the XY stage is carried out the same as that in the first embodiment.

Figure 1C:
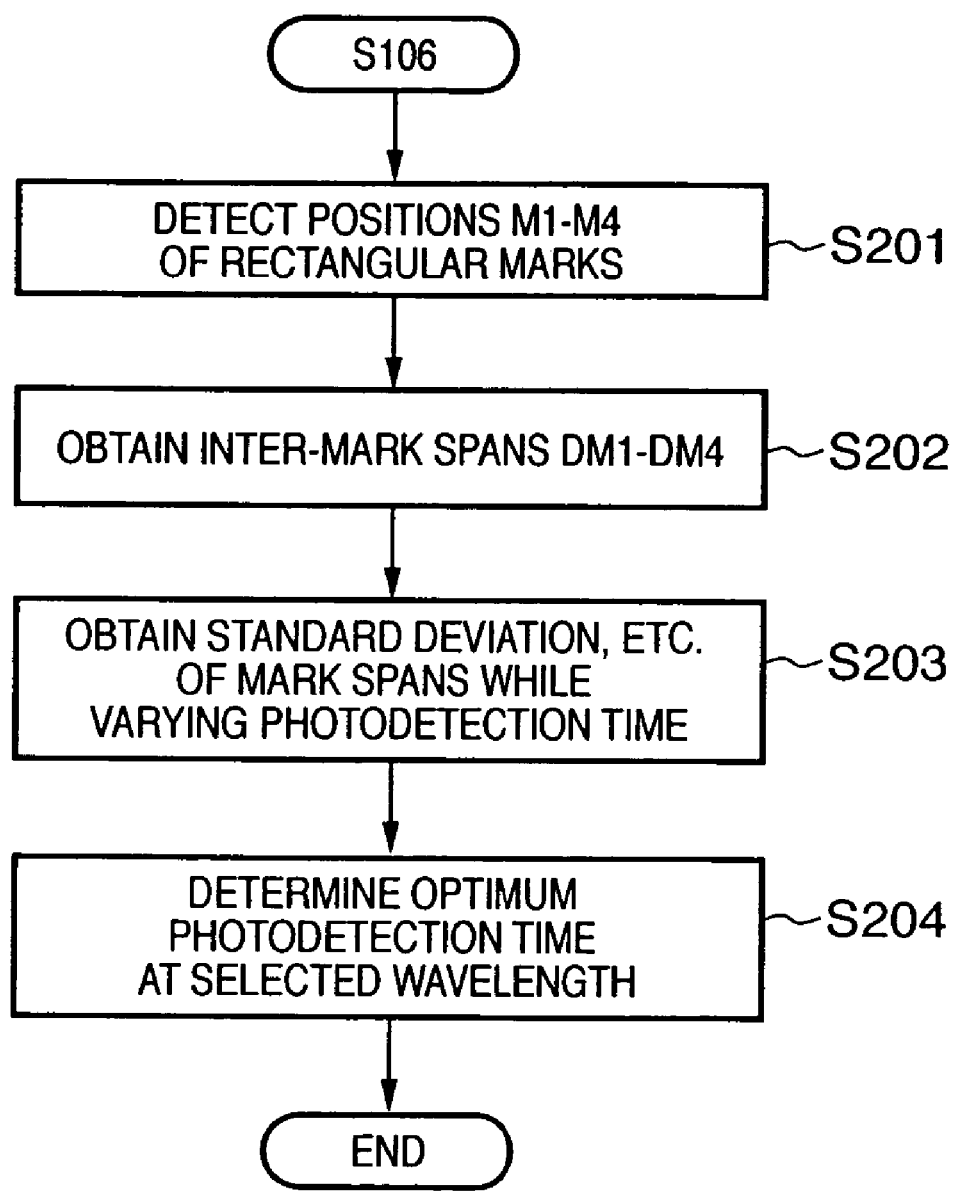
FIG. 1C is a flow chart illustrating the flow of a specific process of a second embodiment of the present invention following step S106 shown in FIG. 11B.

FIG. 1C is a flow chart illustrating the flow of a specific process of a second embodiment succeeding step S106 shown in FIG. 1B. First, in step S201, the positions M1–M4 of the rectangular marks are detected based on the signal of the reference marks SM shown in FIG. 2D using the position detecting unit 9. In step S202, the distance dM1–dM4 between the rectangular marks (the span) is obtained. Here, the variation in the span between the rectangular marks dM1 (=M2–M1)–dM4 (=M4–M1), is caused by such factors as the flickering of the light source of the illumination device 2 and the electrical characteristics of the image capturing device 60. The spans dM1–dM4 between the rectangular marks in the reference marks SM are measured while varying the photodetection time at the image capturing unit 60, and the image capturing evaluation unit 12 successively calculates the variation of the span based on those measurements. FIG. 3C is a diagram showing the measurements of spans dM1–dM4 where the photodetection time has been varied from tc1 to tc2, tc3, . . . tcm, for a light flux of a certain wavelength λ1 summarized as a data table, with the standard deviation (σ) of the spans dM1–dM4 obtained for each and every photodetection time. In addition, where LM1–LM3 are set at a known quantity as the standard length between the rectangular marks as shown in FIG. 2B, the standard deviation, and the like, may be obtained for the difference between the standard length (LMi) and the measured mark span (dMi) (step S203). It should be noted that, as a statistical index, in addition to the standard deviation, the relation between the standard length (LMi), obtained using the spread between the maximum and minimum measured values as the range, or using a least squares operation, and the measurements (dMi) (for example, a parameter such as the slope of an approximate straight line showing such a relation) may be used. These statistical indexes are obtained while the image capturing unit 60 varies the photodetection time for photodetection of the reflected beam. Then, in step S204, the photodetection time is determined based on the statistical indexes obtained in step S203 (for example, using as the optimum photodetection time that photodetection time at which the standard deviation, range, etc., of the mark spans dM1–dM4 are at a minimum). The control unit 16 then sets the photodetection time thus determined in the image capturing unit 60.

In determining the optimum photodetection time, for example, as shown in FIG. 3A described in the first embodiment, the photodetection time tci at the image capturing unit 60 may be set at the horizontal axis and data such as the standard deviation or the range of the mark spans dM1–dM4 showing the variation in the one-dimensional digital signal sequence obtained by the image capturing evaluation unit 12 may be set at the vertical axis, and the photodetection time tcimin at which the variation of the one-dimensional digital signal sequence is at its smallest may be obtained. The photodetection time tcimin obtained in this manner is the photodetection time at which the effect of variations due to the flickering of the light source of the position detection illumination device 2 and the electrical characteristics of the image capturing device 60 is at its smallest. It should be noted that the position detecting unit 9 obtains the photodetection time tcimin for each wavelength of the light flux switched for position detection. In addition, the relation between wavelength and photodetection time, like the LUT described in the first embodiment (FIG. 3B), is stored in the database 15 in the memory in a state in which it can be referenced during alignment detection.

When actually detecting the alignment marks, the photodetection time tcimin is adjusted to the illumination wavelength and an image of the alignment marks is captured. By switching the photodetection time tcimin depending on the selected wavelength, the effects of the flickering of the illumination light, and the like, can be eliminated, and moreover, the photodetection level of the image capturing device 60 can be adjusted so that the S/N ratio is at its greatest. Accordingly, even when switching the wavelengths of the position detection illumination light, an image of excellent S/N ratio can be obtained regardless of the wavelength or the light source corresponding to the wavelength.

In the present embodiment, the photodetection time tcimin is determined in such a way that "variation" in the interval (span) between the rectangular marks in the image capturing signal of the reference marks SM is minimized. However, the target of image capture is not limited to the reference marks SM on the XY stage 11, and may, for example, be the wafer marks WM (shown in FIG. 1A) provided on the wafer W that are the target of the exposure light. Based on the image capturing results obtained by illumination of the wafer marks WM by the illumination device 2, it is possible to determine the photodetection time tcimin at which variation of the intervals of the wafer marks WM is at its smallest. If the process of the present embodiment is adapted to multiple wafers W together with its use in the detection of the wafer marks WM on the wafer W, then it becomes possible to determine the optimum photodetection time tcimin for each wafer even if the state of the wafer surface and the shape of the marks varies with every wafer.

When using the wafer marks WM as references, the optimum photodetection time tcimin may be obtained for all the marks to be measured, but, in such cases, the time required for processing is considerable, so that, for example, it is also possible to shorten the processing time to obtain the photodetection time by obtaining the optimum photodetection time for a typical wafer mark WM (for example, a wafer mark provided for a single sample shot) and image capturing in the photodetection time obtained at the typical wafer mark for other wafer marks. In addition, when the state of the wafer surface and the shape of the wafer marks are standardized within a lot, it is also possible to use the optimum photodetection time tcimin obtained for the first wafer in the lot for the succeeding wafers in the same lot.

Thus, as described above, by finding the optimum photodetection time for an illumination wavelength switched by the wavelength switching unit 10, more accurate alignment marks position detection is possible. In addition, by determining the photodetection time tcimin using as an index the image capture data of the marks on the wafer W, the optimum photodetection time for an actual wafer can be determined.

Third Embodiment

In the second embodiment of the present invention, in order to obtain the optimum photodetection time tcimin, the variation in the span of the marks in the image capturing signal of the reference marks SM or the wafer marks WM is used as the index. However, in the present embodiment, the optimum photodetection level (photodetection time) is determined by using the variation in the detected positions of the reference marks SM provided on the XY stage. In the present embodiment, the process of aligning the image capturing device 60 and the reference marks SM (steps S101–S106 shown in FIG. 11B) is executed, as in the first embodiment.

Figure 1D:
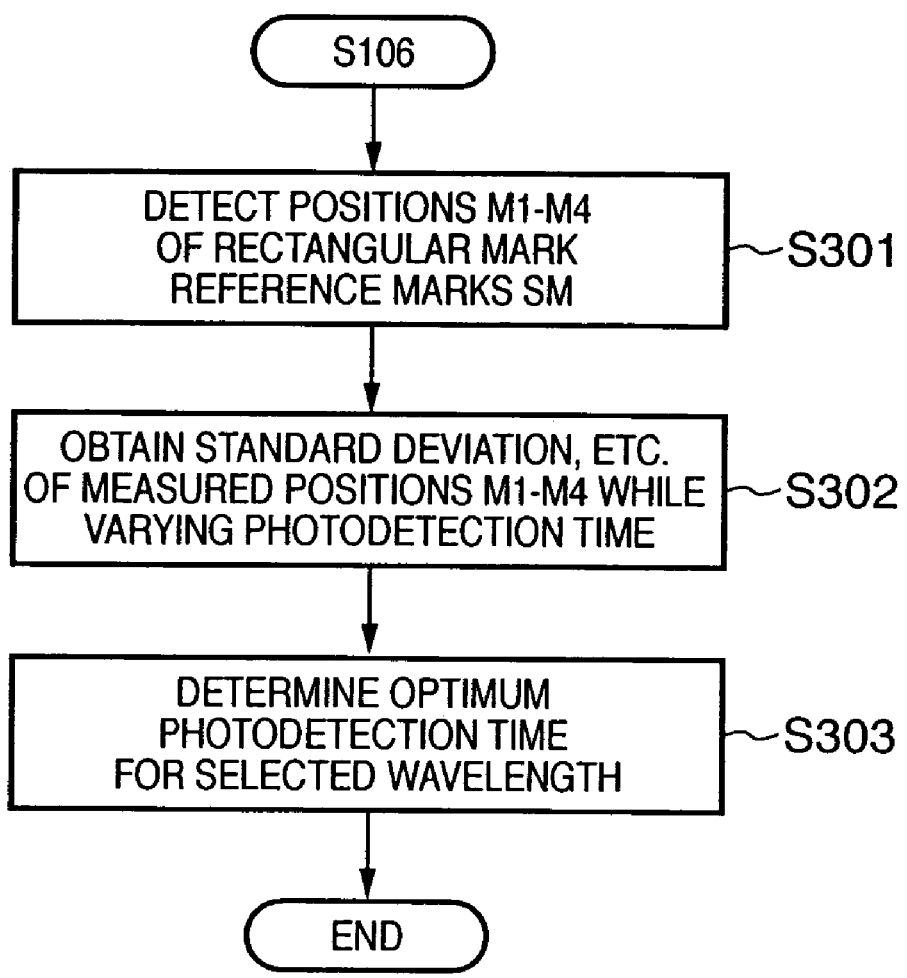
FIG. 1D is a flow chart illustrating the flow of a specific process of a third embodiment of the present invention following step S106 shown in FIG. 11B.

FIG. 1D is a flow chart illustrating the flow of a specific process of a third embodiment of the present invention following step S106 shown in FIG. 1B. First, in a step S301, using the position detecting unit 9, the positions of the peaks corresponding to the centers of the rectangular marks are detected. Here, variation in the reference positions of positions M1–M4 (that is, the designed or actual positions of the rectangular marks) occurs due to such factors as the flickering of the illumination light source and the electrical characteristics of the image capturing device 60, and further, the stage and the interferometers that detect the position of the stage. The peak positions M1–M4 can be obtained, for example, as the positions of the peaks shown in FIG. 2D, in the one-dimensional digital signal sequence $S1(x)$ obtained when image capturing the reference marks SM.

In step S302, variation (standard deviation, etc.) of the detected positions M1–M4 is obtained while varying the photodetection time of the image capturing device 60. It should be noted that, as with the second embodiment, in addition to the standard deviation, the range as the difference between the maximum value and the minimum value may be used as the statistical index of variation.

Then, in step S303, based on the variation (standard deviation, range, or the like) in the positions M1–M4 obtained in step S302, the photodetection time is determined so that the index of variation of the standard deviation, or the like, is at its smallest. The control unit 16 then sets the photodetection time thus determined in the image capturing device 60.

For the determination of the optimum photodetection time, for example, as shown in FIG. 3A described with respect to the first embodiment, the photodetection time tci at the image capturing device 60 may be set along the horizontal axis, an index of variation, such as the standard deviation or range of the measured values M1–M4 obtained by the image capturing evaluation unit 12, may be set along the vertical axis, and the photodetection time tcimin at which the variation in the measured values M1–M4 is at its smallest is obtained. This photodetection time tcimin is the photodetection time at which the effects of variation due to the flickering of the light source of the position detection illumination device 2 and the electrical characteristics of the image capturing device 60 are smallest. In addition, the photodetection time tcimin is obtained for each wavelength of the light flux switched for position detection by the position detecting unit 9. The relation between wavelength and photodetection time is stored in the database 15 in the memory in a state in which it can be referenced when detecting alignment marks, like the LUT (FIG. 3B) described in the first embodiment.

When actually detecting the alignment marks, by varying the photodetection time tcimin according to the detection illumination wavelength and switching the photodetection time tcimin, the effects of flickering of the illumination light, and the like, can be eliminated, and the image capturing device 60 photodetection level can be adjusted so that the S/N ratio is at its greatest. Accordingly, an image of excellent S/N ratio can be obtained regardless of the wavelength or the light source corresponding to the wavelength.

In the present embodiment, the photodetection time is determined in such a way that "variation" in the position of the rectangular marks in the image capturing signal of the reference marks SM is minimized. However, the target of image capture is not limited to the reference marks SM on the XY stage 11, and may, for example, be the wafer marks WM (shown in FIG. 1A) provided on the wafer W that are the target of the exposure light. If the process of the present embodiment is adapted to multiple wafers W together with its use in the detection of the wafer marks WM on the wafer W, then it becomes possible to determine the optimum photodetection time tcimin for each wafer even if the state of the wafer surface and the shape of the marks varies with every wafer.

In addition, although the optimum photodetection time tcimin may be obtained for all the marks to be measured, when obtaining the photodetection time individually, the time required for processing is considerable. Thus, for example, it is also possible to shorten the processing time by obtaining the optimum photodetection time for one typical wafer mark WM (for example, a wafer mark provided for a single sample shot) and image capturing in the photodetection time obtained at the typical wafer mark for other wafer marks. In addition, when the state of the wafer surface and the shape of the wafer marks are standardized within a lot, it is also possible to use the optimum photodetection time tcimin obtained for the first wafer in the lot for the succeeding wafers in the same lot. Thus, as described above, by finding the optimum photodetection time for an illumination wavelength switched by the wavelength switching unit 10, more accurate alignment mark position detection is possible. In addition, by determining the photodetection time tcimin based on the image capture signals of the wafer marks, the optimum photodetection time for an actual wafer can be determined.

In addition, in the determination of the photodetection time described above, by evaluating the positions of the marks taking into account the effects of vibration of the stage, interferometer measurement error, and the like (for example, obtaining mark positions based on data for a plurality of stage positions during photodetection time (for example, an average position of the plurality of positions of the stage)), it is possible to eliminate not only the effects of the flickering of the light source and the electrical characteristics/noise of the image capturing device 60, but also the effects of vibration of the XY stage 11 and measurement error of the laser interferometer, not shown.

Fourth Embodiment

In the second and third embodiments of the present invention described above, the optimum photodetection time is obtained from the intervals (spans) between the rectangular marks that comprise the reference marks SM and the detected positions of the rectangular marks. However, it is also possible to achieve measurement accuracy by obtaining the light level tolerance.

The light level tolerance is the criterion by which it is determined whether or not the image capturing device 60 photodetection level is appropriate for detection of the image capturing of the reference marks SM and the wafer marks WM. By setting the light level tolerance and adjusting the photodetection time and illumination intensity so that the photodetection level is within a light level tolerance range when detecting the positions of the reference marks, and the like, it is possible to shorten the time required to adjust the photodetection time.

In the present embodiment, the process of aligning the image capturing device 60 and the reference marks SM (steps S101–S106 shown in FIG. 1B) is executed in the same way as that in the first embodiment.

Figure 1E:
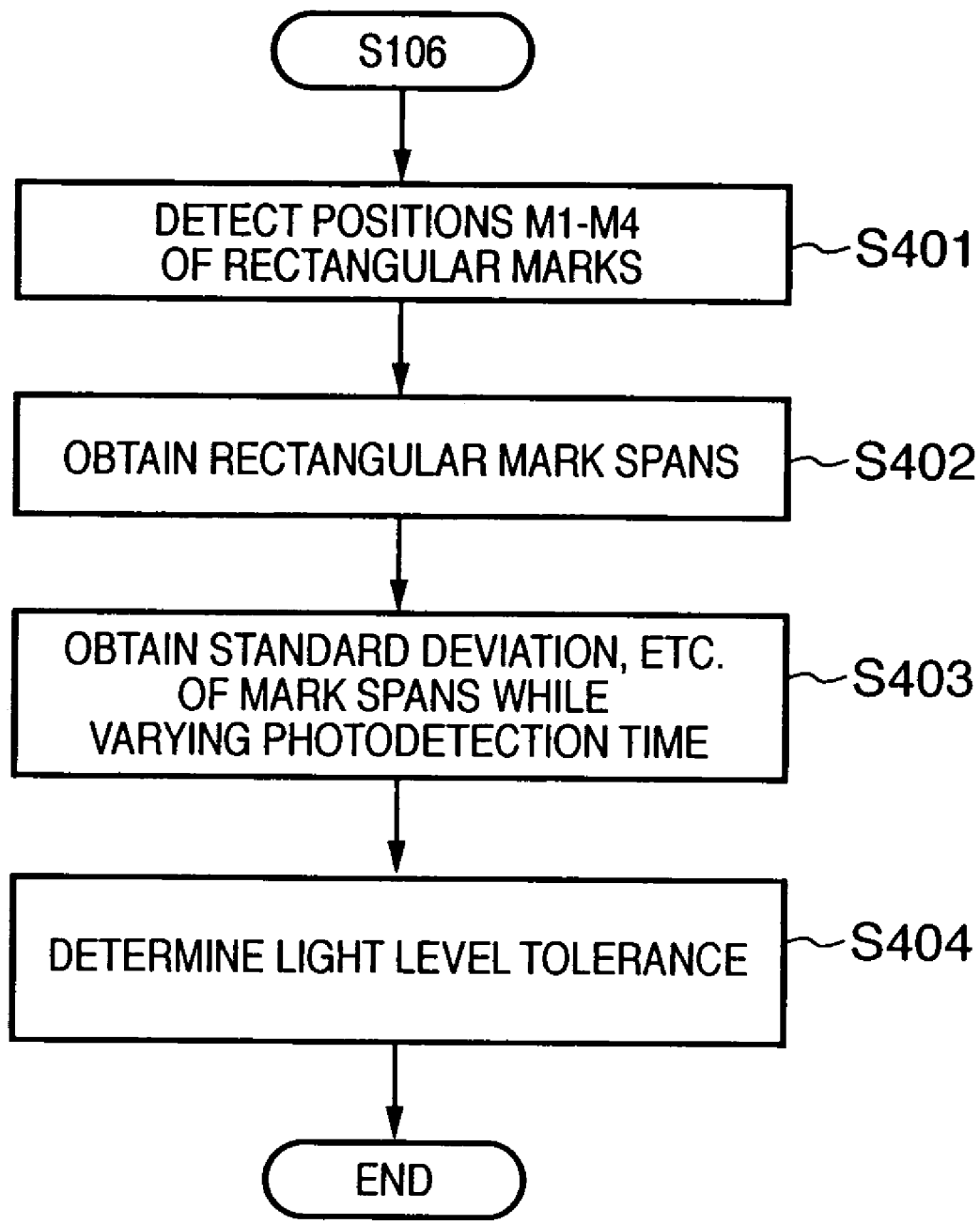
FIG. 1E is a flow chart illustrating the flow of a specific process of a fourth embodiment of the present invention following step S1106 shown in FIG. 1B.

FIG. 1E is a flow chart illustrating the flow of a specific process of a fourth embodiment following step S106 shown in FIG. 1B. First, in a step S401, the positions M1–M4 of the rectangular marks of the image capture signals of the reference marks SM shown in FIG. 2D are detected using the position detecting unit 9. In a step S402, based on the detection results, the spans between the rectangular marks dM1 (=M2−M1), dM2 (=M3−M2), dM3 (=M4−M3), dM4 (=M4−M1) are obtained.

Here, a variation in the spans dM1–dM4 between the rectangular marks, as explained in the preceding embodiments, is caused by such factors as the flickering of the light source of the illumination device 2 and the electrical characteristics of the image capturing device 60.

In step S403, a variation (standard deviation, etc.) in the spans dM1–dM4 thus obtained is successively calculated by the image capturing evaluation unit 12, while varying the light flux wavelength, the image capturing device 60 photodetection time and the illumination intensity. The results, as described with respect to the second embodiment, are summarized in a data table like that shown in FIG. 4B and stored in the database 15. FIG. 4B is a diagram summarizing in table form the relation between the mark span dM1–dM4 detection results and the standard deviation at that time, when the wavelength λ of the light flux used in position detection is λ1 and the photodetection level Hi (determined by the illumination intensity I and the image capturing device 60 photodetection time tci), is changed.

Figure 4A:
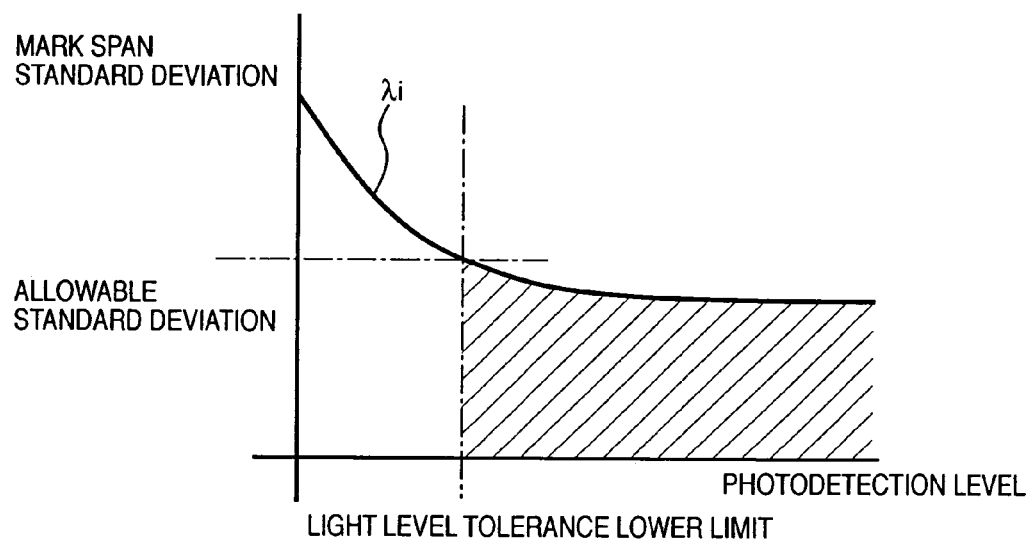
FIG. 4A is a diagram showing the relation between standard deviation and photodetection level, in a case in which a predetermined wavelength λ is fixed.
Figure 5:
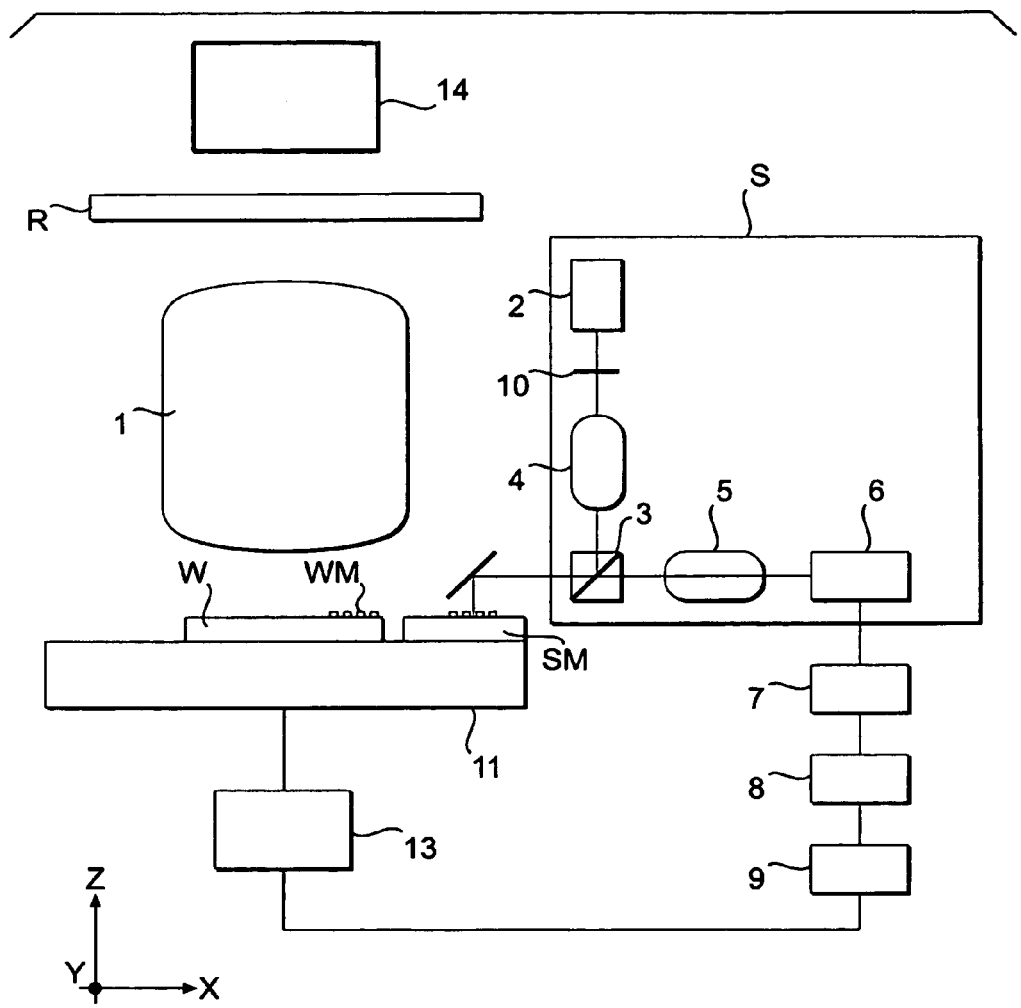
FIG. 5 is a diagram showing an example of the configuration of an exposure apparatus according to a conventional example.

In step S404, the optimum light level tolerance is determined based on the results of the calculations in step S403. As a specific process for determining the optimum light level tolerance, for example, as shown in FIG. 4A, the photodetection level is set on the horizontal axis, the standard deviation of the mark spans is set on the vertical axis, and a photodetection level that provides an allowable standard deviation σai is set as the lower limit of the light level tolerance. In FIG. 4A, the portion indicated by the slanted lines is a photodetection level range that provides variation at or below the allowable standard deviation σai. This range is the light level tolerance. In general, the photodetection level should be as great as possible within the dynamic range of the image capturing device 60 and the A/D conversion unit 7, but the photodetection level may also be small, provided that it is within a range (within the light level tolerance) that does not adversely affect the accuracy with which the positions of the rectangular marks are detected.

FIG. 4A is a diagram showing the relation between standard deviation and photodetection level for a predetermined wavelength λi. The above-described process is executed for each of the illumination wavelengths that can be set by the wavelength switching unit 10, and the light level tolerance obtained on the condition that the standard deviation of the mark spans dM1–dM4 for each wavelength is at or below the allowable standard deviation (S401–S404).

When actually detecting the alignment marks, by switching the photodetection level to Hi within the light level tolerance obtained in the foregoing manner, depending on the illumination wavelength at detection, the effects of the flickering of the illumination light, and the light, can be eliminated, and the photodetection level of the image capturing device 60 can be adjusted so that the S/N ratio is within allowable limits. Accordingly, even when switching the wavelength of the position detection illumination light, an image of excellent S/N ratio can be obtained, regardless of the wavelength, or the light source corresponding to the wavelength. It should be noted that the photodetection level is determined by the intensity of the emitted light flux and the photodetection time of the image capturing device 60, and, therefore, the control unit 16, by adjusting either or both of these parameters, adjusts the illumination unit 2 and/or the image capturing device 60 so as to satisfy the above-described light level tolerance conditions.

In addition, in the present embodiment, the light level tolerance is determined based on variation in the spans between the reference mark SM rectangular marks. However, it is also possible to determined the light level tolerance based on the rectangular marks of the wafer marks WM on the wafer. In this case, by adapting the process of the present embodiment to multiple wafers W, as well as using the wafer marks WM on the wafer, it then becomes possible to determine the light level tolerance for each wafer even if the state of the wafer surface and the shape of the marks varies with every wafer. Although the light level tolerance may be obtained for each mark on the wafer, if the light level tolerance is obtained from a representative mark on the wafer (for example, a mark provided in correspondence to a single sample shot region) and the light level tolerance obtained for that representative mark is then used for the other marks, then the processing time required to obtain the light level tolerance can be shortened. In addition, it is also possible to use the light level tolerance obtained for the first wafer in the lot for succeeding wafers in the same lot.

Thus, as described above, by adjusting the photodetection level so as to satisfy conditions for light level tolerance preset for each illumination wavelength, more accurate alignment mark position detection is possible. In addition, by determining the light level tolerance based on the image capture data of the marks on the wafer, the optimum light level tolerance for an actual wafer can be determined.

According to the present invention, it becomes possible to provide a high-accuracy position detection technology that reduces deterioration in accuracy like that described above.

Embodiment of a Device Manufacturing Method

Figure 6:
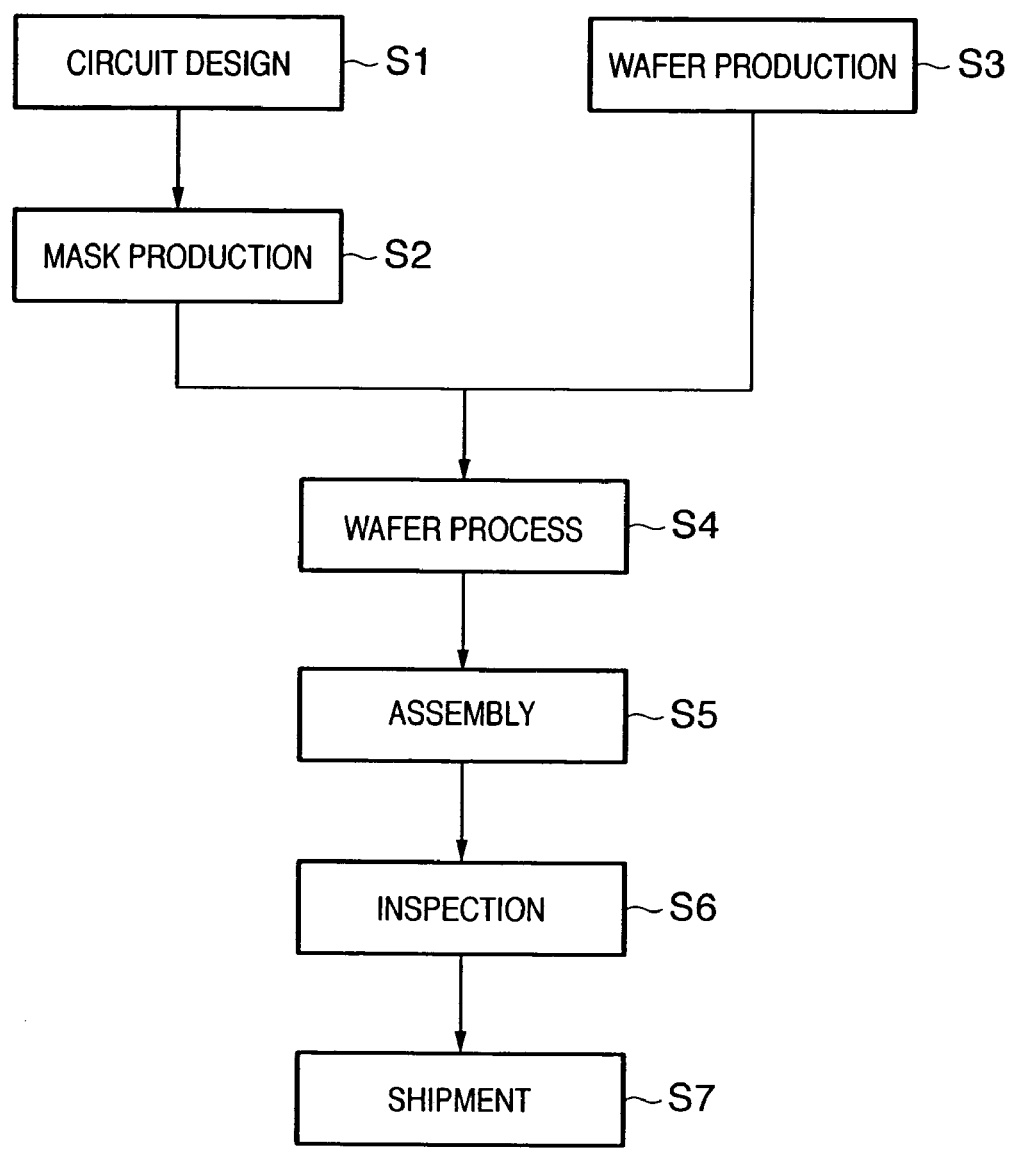
FIG. 6 is a diagram showing the overall manufacturing process flow for a semiconductor device.

Next, a description is given of a semiconductor device manufacturing process utilizing the exposure apparatus described above. FIG. 6 is a diagram showing the flow of the overall manufacturing process for a semiconductor device. In step 1 (circuit design), the design of the semiconductor device is carried out. In step 2 (mask production), a mask is produced based on the designed circuit pattern. At the same time, in step 3 (wafer production), a wafer is manufactured using a raw material, such as silicon. Step 4 (wafer process), is called a pre-process, in which, using the mask and wafer described above, an actual circuit is formed on the wafer using lithography. The succeeding step 5 (assembly), is called a post-process, and is a step in which a semiconductor chip is put together using the wafer produced in step 3, while also including such assembly processing as an assembly step (dicing, bonding) and a packaging step (chip insertion). In step 6 (inspection), the operation and durability of the semiconductor device produced in step 5 are tested. Through such processes, a semiconductor device is completed and, in step 7, shipped.

Figure 7:
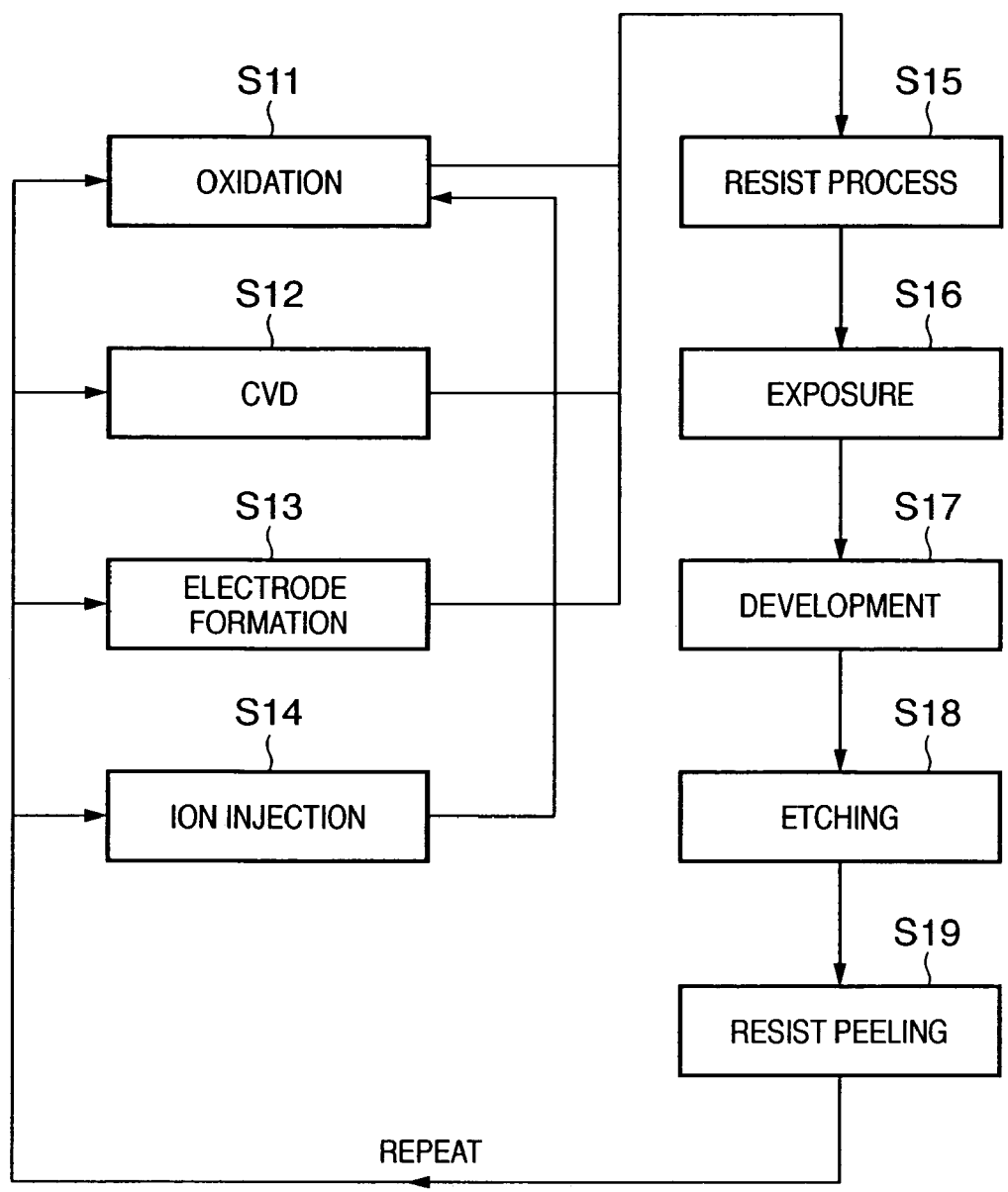
FIG. 7 is a diagram showing the detailed flow of a wafer process.

FIG. 7 is a diagram showing the detailed flow of the above-described wafer process. In step 11 (oxidation), the surface of the wafer is oxidized. In step 12 (CVD), an insulating layer is formed on the wafer surface. In step 13 (electrode formation), an electrode is formed on the wafer by vapor deposition. In step 14 (ion injection), ions are injected into the wafer. In step 15 (resist process), the wafer is coated with a photosensitive agent. In step 16 (exposure), a circuit pattern is transferred to the wafer by the exposure apparatus described above. In step 17 (development), the exposed wafer is developed. In step 18 (etching), all portions other than the developed resist image are removed. In step 19 (resist peeling), etching is finished and the no-longer-needed resist is removed. By repeating these steps, a multi-layered circuit pattern is built upon the wafer. According to the present invention, it is possible to provide this device manufacturing process adapting a position detection technology that reduces deterioration in accuracy like that described above.

As many apparently widely different embodiments of the present invention can be made without departing from the spirit and scope thereof, it is to be understood that the invention is not limited to the specific preferred embodiments described above, except as defined in the claims.

CLAIM OF PRIORITY

This application claims priority from Japanese Patent Application No. 2004-106361 filed Mar. 31, 2004, which is hereby incorporated by reference herein.

What is claimed is:

1. A position measurement apparatus for measuring a position of a mark, said apparatus comprising:

an image capturing unit configured to capture an image of the mark;

a calculator configured to calculate variation in image data captured by said image capturing unit; and a controller configured to set a parameter concerning a light amount to be received by said image capturing unit, based on variations respectively calculated by said calculator with respect to a plurality of image data acquired by said image capturing unit at light amounts received by said image capturing unit, the light amounts being different from each other.

2. An apparatus according to claim 1, wherein said calculator is configured to calculate one of a standard deviation and a range of the image data as the variation.

3. An apparatus according to claim 1, wherein said controller is configured to set, as the parameter, one of a storage time of said image capturing unit and a tolerance of light amount to be received by said image capturing unit.

4. An apparatus according to claim 1, wherein said controller is configured to set the parameter so as to minimize the variation.

5. An apparatus according to claim 1, wherein said controller is configured to set the parameter so that the variation is not greater than a tolerance.

6. An apparatus according to claim 1, wherein said controller is configured to set, as the parameter, a tolerance of light amount to be received by said image capturing unit so that the variation is not greater than a tolerance.

7. An apparatus according to claim 1, further comprising a detecting unit configured to obtain a span between portions of the mark based on the image data, wherein said calculator is configured to calculate, as the variation, variation of differences between a plurality of spans obtained by said detecting unit and a plurality of reference spans respectively corresponding to the plurality of spans.

8. An apparatus according to claim 1, further comprising a detecting unit configured to obtain positions of portions of the mark based on the image data, wherein said calculator is configured to calculate, as the variation, variation of differences between a plurality of positions obtained by said detecting unit and a plurality of reference positions respectively corresponding to the plurality of positions.

9. An apparatus according to claim 1, further comprising an illuminator configured to illuminate the mark with light of which wavelength is variable, wherein said controller is configured to set the parameter with respect to each of a plurality of the wavelengths.

10. An exposure apparatus for exposing a substrate to a pattern, said apparatus comprising:

a position measurement apparatus as defined in claim 1 for measuring a position of a mark arranged in said exposure apparatus.

11. An apparatus according to claim 10, wherein said position measurement apparatus is configured to measure a position of a mark on the substrate.

12. An apparatus according to claim 10, further comprising a stage configured to hold the substrate and to move, wherein said position measurement apparatus is configured to measure a position of a mark on said stage.

13. An apparatus according to claim 10, further comprising a stage configured to hold the substrate and to move, wherein said image capturing unit is configured to capture an image of a reference surface on said stage to aquire the image data.

14. An apparatus according to claim 10, further comprising a detecting unit configured to obtain a span between portions of the mark based on the image data, wherein said calculator is configured to calculate, as the variation, variation of differences between a plurality of spans obtained by said detecting unit and a plurality of reference spans respectively corresponding to the plurality of spans.

15. An apparatus according to claim 10, further comprising a detecting unit configured to obtain positions of portions of the mark based on the image data, wherein said calculator is configured to calculate, as the variation, variation of differences between a plurality of positions obtained by said detecting unit and a plurality of reference positions respectively corresponding to the plurality of positions.

16. An apparatus according to claim 14, wherein the mark is a mark on the substrate.

17. An apparatus according to claim 14, further comprising a stage configured to hold the substrate and to move, wherein the mark is a mark on said stage.

18. A method of manufacturing a device, said method comprising steps of:
exposing a substrate to a pattern using an exposure apparatus as defined in claim 10; developing the exposed substrate; and
processing the developed substrate to manufacture the device.

19. A position measurement method of measuring a position of a mark, said method comprising steps of:
capturing an image of the mark using an image capturing unit;
calculating a variation of image data acquired in said capturing step; and
setting a parameter concerning a light amount to be received by the image capturing unit, based on variations respectively calculated in said calculating step with respect to a plurality of image data acquired in said capturing step at light amounts received by the image capturing unit, the light amounts being different from each other.

20. A method according to claim 19, wherein said calculating step calculates one of a standard deviation and a range of the image data as the variation.

21. A position detecting method according to claim 19, wherein said setting step set, as the parameter, one of a storage time of the image capturing unit and a tolerance of light amount to be received by the image capturing unit.

22. A method according to claim 19, wherein said setting step sets the parameter so as to minimize the variation.

23. A method according to claim 19, wherein said setting step sets the parameter so that the variation is not greater than a tolerance.

24. A method according to claim 19, wherein said setting step set, as the parameter, a tolerance of light amount to be received by the image capturing unit so that the variation is not greater than a tolerance.

25. A method according to claim 19, further comprising detecting step of detecting a span between portions of the mark based on the image data, wherein said calculating step calculates the variation of differences between a plurality of spans detected in said detecting step and a plurality of reference spans respectively corresponding to the plurality of spans.

26. A method according to claim 19, further comprising detecting step of detecting positions of portions of the mark based on the image data, wherein said calculating step calculates the variation of differences between a plurality of positions detected in said detecting step and a plurality of reference positions respectively corresponding to the plurality of positions.

27. A method according to claim 19, wherein said setting step sets the parameter with respect to each of a plurality of wavelengths of light with which the mark is illuminated by an illuminator.

* * * * *

UNITED STATES PATENT AND TRADEMARK OFFICE
CERTIFICATE OF CORRECTION

PATENT NO. : 7,126,670 B2 Page 1 of 1
APPLICATION NO. : 11/085545
DATED : October 24, 2006
INVENTOR(S) : Nozomu Hayashi It is certified that error appears in the above-identified patent and that said Letters Patent is hereby corrected as shown below:

COLUMN 2:
  Line 19, "determined" should read -- determine --.

COLUMN 3:
  Line 24, "FIG. 11B;" should read -- FIG. 1B; --.
  Line 27, "FIG. 11B:" should read -- FIG. 1B; --.
  Line 30, "S1106" should read -- S106 --.

COLUMN 4:
  Line 34, "and" should read -- an --.
  Line 47, "111" should read -- 11 --.

COLUMN 12:
  Line 51, "determined" should read -- determine --.

COLUMN 16:
  Line 5, "set," should read -- sets, --.
  Line 14, "set," should read -- sets, --.

Signed and Sealed this

Twelfth Day of June, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,126,670 B2 | Page 1 of 1 |
| APPLICATION NO. | : 11/085545 | |
| DATED | : October 24, 2006 | |
| INVENTOR(S) | : Nozomu Hayashi | |

It is certified that error appears in the above-identified patent and that said Letters Patent is hereby corrected as shown below:

ON THE COVER PAGE:
   In item "(56) References Cited," after "FOREIGN PATENT DOCUMENTS," insert the following:

-- OTHER PUBLICATIONS

Japanese Office Action dated May 22, 2006, issued in corresponding Japanese patent application number 2004-106361, with an English translation. --

Signed and Sealed this

Twenty-fourth Day of November, 2009

David J. Kappos
*Director of the United States Patent and Trademark Office*